(12) United States Patent
McHugh et al.

(10) Patent No.: US 7,247,223 B2
(45) Date of Patent: Jul. 24, 2007

(54) METHOD AND APPARATUS FOR CONTROLLING VESSEL CHARACTERISTICS, INCLUDING SHAPE AND THIEVING CURRENT FOR PROCESSING MICROFEATURE WORKPIECES

(75) Inventors: Paul R. McHugh, Kalispell, MT (US); Gregory J. Wilson, Kalispell, MT (US); Kyle M. Hanson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 374 days.

(21) Appl. No.: 10/426,029

(22) Filed: Apr. 28, 2003

(65) Prior Publication Data

US 2004/0007467 A1    Jan. 15, 2004

Related U.S. Application Data

(63) Continuation-in-part of application No. 10/158,220, filed on May 29, 2002.

(51) Int. Cl.
*C25D 17/02* (2006.01)
*C25D 7/12* (2006.01)

(52) U.S. Cl. .................................................. 204/275.1

(58) Field of Classification Search ...................... None
See application file for complete search history.

(56) References Cited

U.S. PATENT DOCUMENTS

| | | |
|---|---|---|
| 1,526,644 A | 2/1925 | Pinney |
| 1,881,713 A | 10/1932 | Laukel |
| 3,616,284 A | 10/1971 | Bodmer et al. |
| 4,046,105 A | 9/1977 | Gomez |
| 4,170,959 A | 10/1979 | Aigo |
| 4,304,641 A | 12/1981 | Grandia et al. |
| 4,323,433 A | 4/1982 | Loch |
| 4,378,283 A | 3/1983 | Seyffert et al. |
| 4,391,694 A | 7/1983 | Runsten |

(Continued)

FOREIGN PATENT DOCUMENTS

EP    0290210 A2    11/1988

(Continued)

OTHER PUBLICATIONS

U.S. Appl. No. 08/940,670, filed Sep. 30, 1997, Graham et al.

(Continued)

*Primary Examiner*—Harry D. Wilkins, III
(74) *Attorney, Agent, or Firm*—Perkins Coie LLP

(57) ABSTRACT

A method and apparatus for processing a microfeature workpiece. In one embodiment, the apparatus includes a support member configured to carry a microfeature workpiece at a workpiece plane, and a vessel positioned at least proximate to the support member. The vessel has a vessel surface facing toward the support member and positioned to carry a processing liquid. The vessel surface is shaped to provide an at least approximately uniform current density at the workpiece plane. At least one electrode, such as a thieving electrode, is disposed within the vessel. In a further aspect of this embodiment, the thieving electrode can be easily removable along with conductive material it attracts from the processing liquid. The shape of the vessel surface, the current supplied to the thieving electrode and/or the diameter of an aperture upstream of the workpiece are changed dynamically in other embodiments.

44 Claims, 9 Drawing Sheets

U.S. PATENT DOCUMENTS

| | | | |
|---|---|---|---|
| 4,466,864 A | 8/1984 | Bacon et al. | |
| 4,634,503 A | 1/1987 | Nogavich | |
| 4,828,654 A | 5/1989 | Reed | |
| 4,906,341 A | 3/1990 | Yamakawa et al. | |
| 5,000,827 A | 3/1991 | Schuster et al. | |
| 5,078,852 A | 1/1992 | Yee et al. | |
| 5,090,432 A * | 2/1992 | Bran | 134/139 |
| 5,135,636 A * | 8/1992 | Yee et al. | 205/96 |
| 5,156,730 A | 10/1992 | Bhatt et al. | |
| 5,168,887 A | 12/1992 | Thompson et al. | |
| 5,217,586 A | 6/1993 | Datta et al. | |
| 5,228,966 A | 7/1993 | Murata | |
| 5,256,274 A | 10/1993 | Poris | |
| 5,344,491 A | 9/1994 | Katou | |
| 5,368,711 A | 11/1994 | Poris | |
| 5,376,176 A | 12/1994 | Kuriyama | |
| 5,391,285 A | 2/1995 | Lytle et al. | |
| 5,429,733 A | 7/1995 | Ishida | |
| 5,437,777 A | 8/1995 | Kishi | |
| 5,443,707 A | 8/1995 | Mori | |
| 5,662,788 A | 9/1997 | Sandhu et al. | |
| 5,670,034 A | 9/1997 | Lowery | |
| 5,681,392 A | 10/1997 | Swain | |
| 5,723,028 A | 3/1998 | Poris | |
| 6,027,631 A | 2/2000 | Broadbent | |
| 6,074,544 A | 6/2000 | Reid et al. | |
| 6,080,691 A | 6/2000 | Lindsay et al. | |
| 6,090,260 A | 7/2000 | Inoue et al. | |
| 6,099,702 A | 8/2000 | Reid et al. | |
| 6,099,712 A | 8/2000 | Ritzdorf et al. | |
| 6,103,096 A * | 8/2000 | Datta et al. | 205/686 |
| 6,110,346 A | 8/2000 | Reid et al. | |
| 6,156,167 A | 12/2000 | Patton et al. | |
| 6,159,354 A | 12/2000 | Contolini et al. | |
| 6,162,344 A | 12/2000 | Reid et al. | |
| 6,174,425 B1 | 1/2001 | Simpson et al. | |
| 6,179,983 B1 | 1/2001 | Reid et al. | |
| 6,193,859 B1 | 2/2001 | Contolini et al. | |
| 6,228,232 B1 | 5/2001 | Woodruff et al. | |
| 6,258,220 B1 | 7/2001 | Dordi et al. | |
| 6,261,433 B1 | 7/2001 | Landau | |
| 6,270,647 B1 | 8/2001 | Graham et al. | |
| 6,391,166 B1 * | 5/2002 | Wang | 204/224 R |
| 6,402,923 B1 | 6/2002 | Mayer et al. | |
| 6,444,101 B1 | 9/2002 | Stevens et al. | |
| 6,466,864 B1 | 10/2002 | Stefan et al. | |
| 6,491,806 B1 | 12/2002 | Dubin et al. | |
| 6,565,729 B2 * | 5/2003 | Chen et al. | 205/82 |
| 6,755,954 B2 | 6/2004 | Mayer et al. | |
| 6,773,571 B1 | 8/2004 | Mayer et al. | |
| 2002/0008034 A1 * | 1/2002 | Chen et al. | 205/82 |
| 2002/0046952 A1 | 4/2002 | Graham et al. | |
| 2002/0163487 A1 | 11/2002 | Sudo et al. | |
| 2002/0195352 A1 | 12/2002 | Mayer et al. | |
| 2003/0038035 A1 | 2/2003 | Wilson | |

FOREIGN PATENT DOCUMENTS

| | | |
|---|---|---|
| WO | WO 99/16936 A1 | 4/1999 |
| WO | WO 00/61498 A2 | 10/2000 |
| WO | WO 00/61837 A1 | 10/2000 |

OTHER PUBLICATIONS

Lee, Tien-Yu Tom et al. "Application of a CFD Tool in Designing a Fountain Plating Cell for Uniform Bump Plating of Semiconductor Wafers," IEEE Transactions on Components, Packaging and Manufacturing Technology, Feb. 1996, pp. 131-137, vol. 19, No. 1.

Lowenheim, F.A., "Electroplating," Jan. 22, 1979, 12 pgs, McGraw-Hill Book Company, New York.

* cited by examiner

METHOD AND APPARATUS FOR CONTROLLING VESSEL CHARACTERISTICS, INCLUDING SHAPE AND THIEVING CURRENT FOR PROCESSING MICROFEATURE WORKPIECES

CROSS-REFERENCE TO RELATED APPLICATIONS

The present application is a continuation-in-part of pending U.S. patent application Ser. No. 10/158,220 filed May 29, 2002 and incorporated herein in its entirety by reference. The present application is related to the following pending U.S. Patent applications, all of which are incorporated herein in their entireties by reference: Ser. No. 09/875,365, filed Jun. 5, 2001; Ser. No. 09/872,151, filed May 31, 2001; Ser. No. 10/080,914, filed Feb. 22, 2002; and Ser. No. 10/080,915, filed Feb. 22, 2002.

TECHNICAL FIELD

The following disclosure relates generally to methods and apparatuses for controlling a shape of a microfeature workpiece processing vessel and/or a thieving current applied while processing the microfeature workpiece.

BACKGROUND

Microelectronic devices, such as semiconductor devices and field emission displays, are generally fabricated on and/or in microfeature workpieces using several different types of machines ("tools"). Many such processing machines have a single processing station that performs one or more procedures on the workpieces. Other processing machines have a plurality of processing stations that perform a series of different procedures on individual workpieces or batches of workpieces. In a typical fabrication process, one or more layers of conductive materials are formed on the workpieces during deposition stages. The workpieces are then typically subject to etching and/or polishing procedures (i.e., planarization) to remove a portion of the deposited conductive layers for forming electrically isolated contacts and/or conductive lines.

Plating tools that plate metals or other materials on the workpieces are becoming an increasingly useful type of processing machine. Electroplating and electroless plating techniques can be used to deposit nickel, copper, solder, permalloy, gold, silver, platinum and other metals onto workpieces for forming blanket layers or patterned layers. A typical metal plating process involves depositing a seed layer onto the surface of the workpiece using chemical vapor deposition (CVD), physical vapor deposition (PVD), or other suitable methods. After forming the seed layer, a blanket layer or pattern layer of metal may be deposited on the workpiece by an appropriate electroplating or electroless processing technique. In either process, the workpiece may then be cleaned, etched and/or annealed in subsequent procedures before transferring the workpiece to another processing machine.

One potential drawback with the foregoing techniques is that depositing the seed layer can be a time consuming process that typically requires a specialized process station. One approach to addressing this problem is to reduce the thickness of the seed layer so as to reduce the time required to deposit the seed layer. One potential drawback with this solution is that it can be difficult to uniformly electrolytically plate a blanket layer on a very thin seed layer. For example, the current density may vary over a thin seed layer, leading to nonuniformities in the applied blanket layer. In one particular example, the current density may be significantly higher near the junctions between the seed layer and a contact assembly (which applies an electrical charge to the seed layer), than it is at points distant from these junctions. This effect is referred to in the industry as the "terminal effect." The terminal effect can result in electroplated layers that (a) are not uniformly thick and/or (b) contain voids and/or (c) non-uniformly incorporate impurities or defects. These characteristics tend to reduce the effectiveness and/or reliability of the devices formed from the microfeature workpiece.

SUMMARY

The present invention is directed toward methods and apparatuses for controlling characteristics of a vessel, including its shape and/or a thieving current during microfeature workpiece processing. These approaches, individually and/or together, are used to improve the uniformity with which conductive materials are applied to the workpiece, or deliberately form a contoured conductive layer on the workpiece. One aspect of several embodiments of the invention includes shaping a surface of a vessel to provide a uniform current density at a microfeature workpiece supported in fluid communication with the vessel. For example, in one embodiment, the surface is curved, and in a particular aspect of this embodiment, the distance between points on the vessel surface and the microfeature workpiece are inversely proportional to the square of the distance between the points and a central vessel axis. In another embodiment, the shape of the vessel wall changes during processing.

In other embodiments, electrodes are coupled in fluid communication with the vessel and can be connected to current sources of opposite polarities. Accordingly, one of the electrodes can act as a current thief or cathode, while one or more other electrodes act as anodes. The current supplied to the electrodes can be controlled to exercise further control over the current density at the workpiece. In still further embodiments, a shield or other device positioned between the workpiece and the electrodes can have an aperture that changes diameter during processing.

In still a further aspect of the invention, an electrode support is positioned within the vessel and includes a cavity positioned to removably support an electrode. The cavity has a first sidewall and a second sidewall canted outwardly from the first sidewall as the sidewalls extend toward a support member configured to carry the microfeature workpiece. Accordingly, the shape of the cavity can allow the electrode to be easily removed after it has accumulated conductive material. An embodiment of this arrangement is particularly suitable for current thieves, as it allows the current thieves to be removed and replaced or cleaned without requiring the vessel to be extensively disassembled.

DETAILED DESCRIPTION

The following description discloses the details and features of several embodiments of processing stations, integrated tools and associated methods for processing microfeature workpieces. The term "microfeature workpiece" is used throughout to include a workpiece formed from a substrate upon which and/or in which submicron circuits or components, and/or data storage elements or layers are fabricated. Submicron features in the substrate include but are not limited to trenches, vias, lines, and holes. These features typically have a submicron width (e.g., ranging from, for example, 0.1 micron to 0.75 micron) generally transverse to a major surface (e.g., a front side or a backside) of the workpiece. The term "microfeature workpieces" is also used to include substrates upon which and/or in which micromechanical features are formed. Such features include read/write head features and other micromechanical elements having submicron or supramicron dimensions. In any of these embodiments, the workpiece substrate is formed from suitable materials, including ceramics, and may support layers and/or other formations of other materials, including but not limited to metals, dielectric materials and photoresists.

Figure 1:
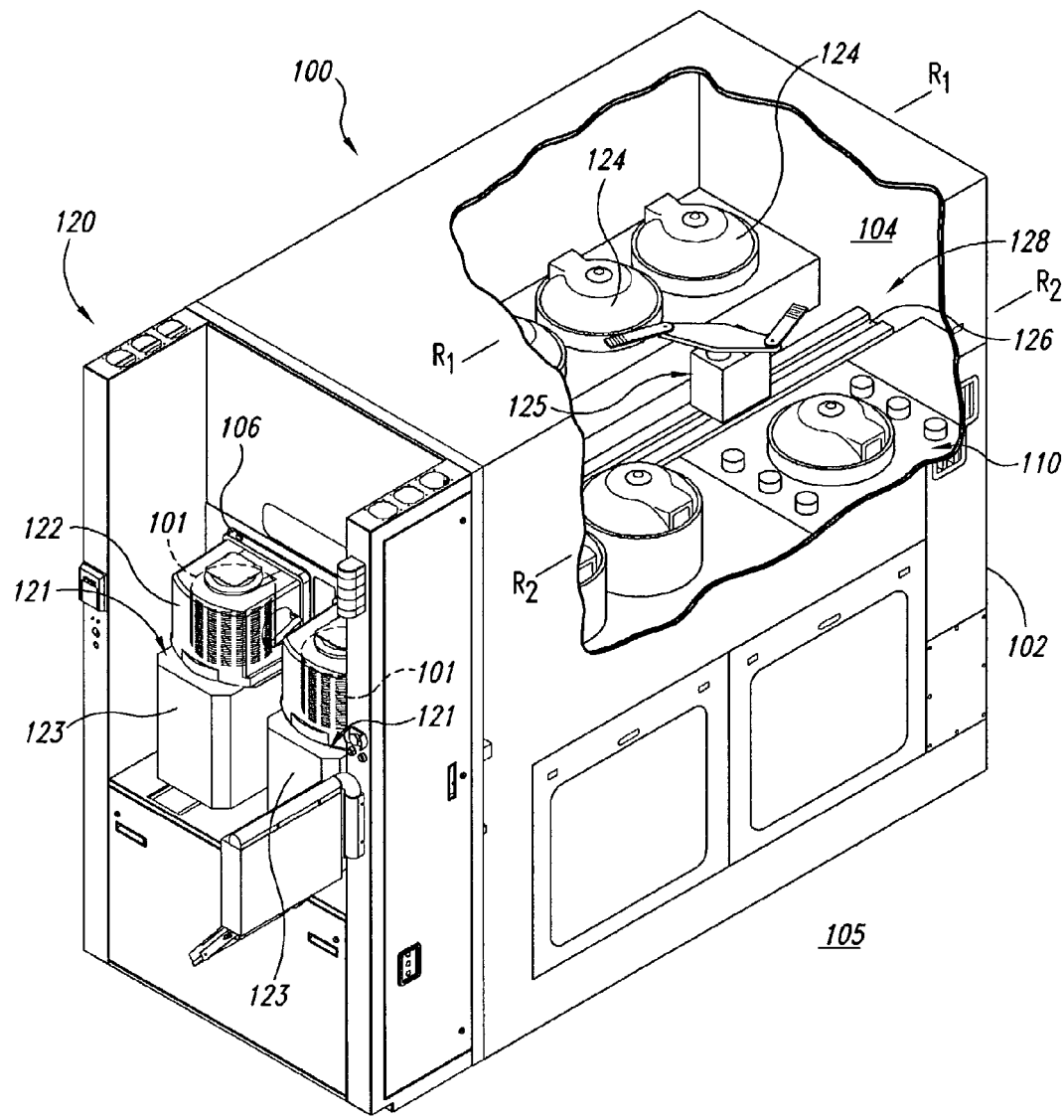
FIG. 1 is an isometric view of a processing machine having one or more chemical processing stations for processing microfeature workpieces in accordance with an embodiment of the invention.

FIG. 1 is an isometric view of a processing machine 100 having a processing station 110 in accordance with an embodiment of the invention. A portion of the processing machine 100 is shown in cut-away view to illustrate selected internal components. In one aspect of this embodiment, the processing machine 100 includes a cabinet or enclosure 102 having an interior region 104 that is at least partially isolated from an exterior region 105. The cabinet 102 also includes a plurality of apertures 106 (of which one is shown in FIG. 1) through which microfeature workpieces 101 can move between the interior region 104 and a load/unload station 120.

In a further aspect of this embodiment, the load/unload station 120 has two container supports 121 that are each housed in a protective shroud 123. The container supports 121 are configured to position workpiece containers 122 relative to the apertures 106 in the cabinet 102. The workpiece containers 122 each house a plurality of the microfeature workpieces 101 in a "mini" clean environment suitable for carrying a plurality of workpieces 101 through other environments that are not at clean room standards. Each of the workpiece containers 122 is accessible from the interior region 104 of the cabinet 102 through the apertures 106.

In a further aspect of this embodiment, the processing machine 100 also includes a plurality of other processing stations 124, (such as annealing stations, clean/etch capsules, and/or metrology stations) and a transfer device 128 that moves the microfeature workpieces 101 between the load/unload station 120 and the processing stations 110, 124. In one embodiment, the transfer device 128 includes a linear track 126 extending in a lengthwise direction of the interior region 104 between the processing stations 110, 124. In one aspect of this embodiment, the transfer device 128 further includes a robot unit 125 carried by the track 126. In a particular embodiment shown in FIG. 1, a first set of processing stations is arranged along a first row $R_1$—$R_1$ and a second set of processing stations is arranged along a second row $R_2$—$R_2$. The linear track 126 extends between the first and second rows of processing stations, and the robot unit 125 can access any of the processing stations along the track 126.

Figure 2:
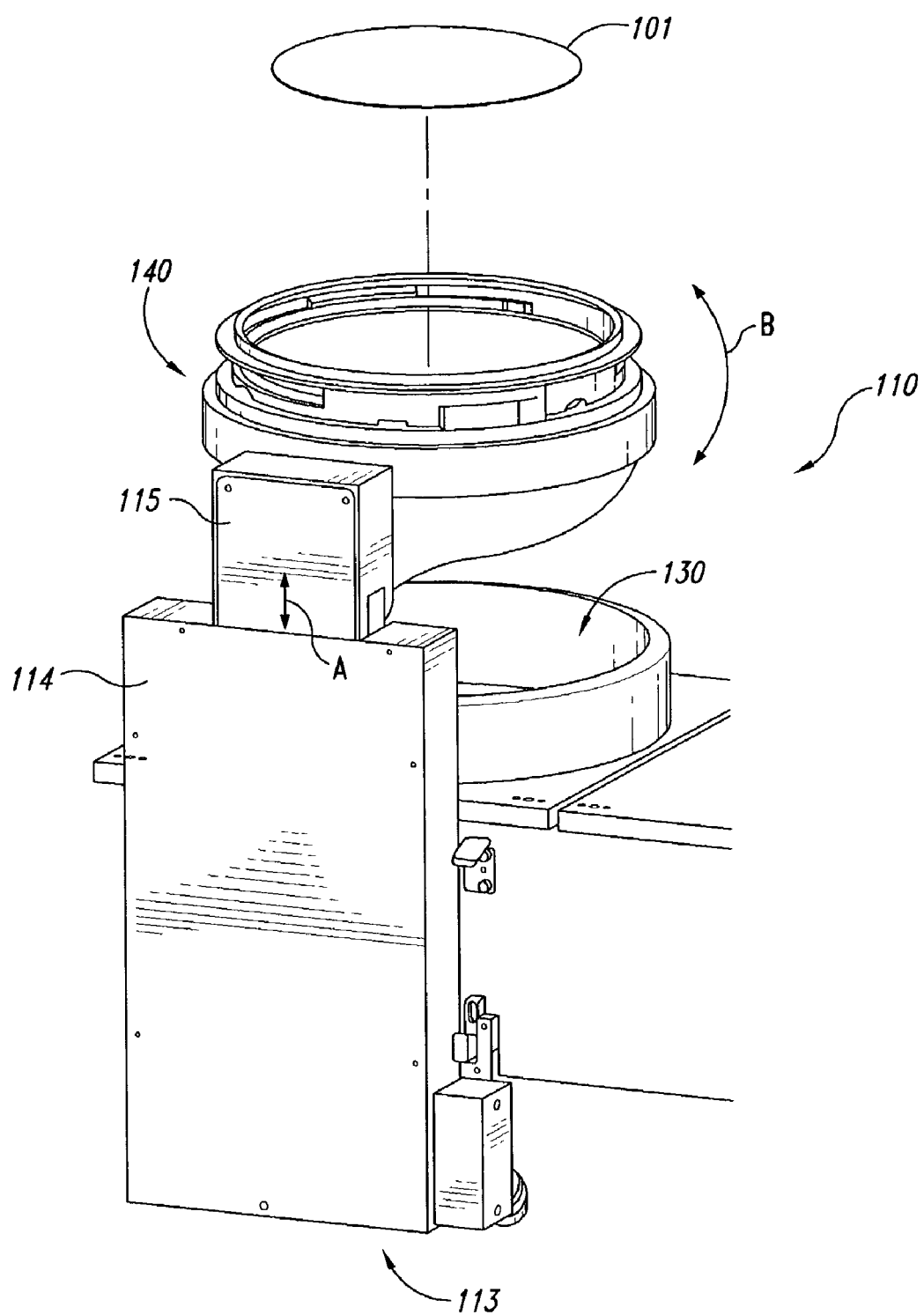
FIG. 2 is a rear isometric view of a lift and rotate assembly for supporting a microfeature workpiece during processing in accordance with an embodiment of the invention.

FIG. 2 illustrates a rear isometric view of a processing station 110 (generally similar to the one shown in FIG. 1) configured in accordance with an embodiment of the invention. In one aspect of this embodiment, the processing station 110 includes a vessel 130 configured to support a processing liquid, such as an electrolytic processing liquid. In a further aspect of this embodiment, the processing station 110 includes a lift and rotate assembly 113 that receives a microfeature workpiece 101 from the robot unit 125 (FIG. 1) and lowers the microfeature workpiece 101 into contact with the processing liquid in the vessel 130. In one embodiment, the lift and rotate assembly 113 includes a base 114, a lift 115 that moves upwardly and downwardly relative to the base 114 (as indicated by arrow A), and a support member 140 carried by the lift 115. The support member 140 can rotate as indicated by arrow B between an upwardly facing position (shown in FIG. 2) to receive the microfeature workpiece 101, and a downwardly facing position (described below with reference to FIG. 3) to engage the microfeature workpiece 101 with the liquid in the vessel 130.

Figure 3:
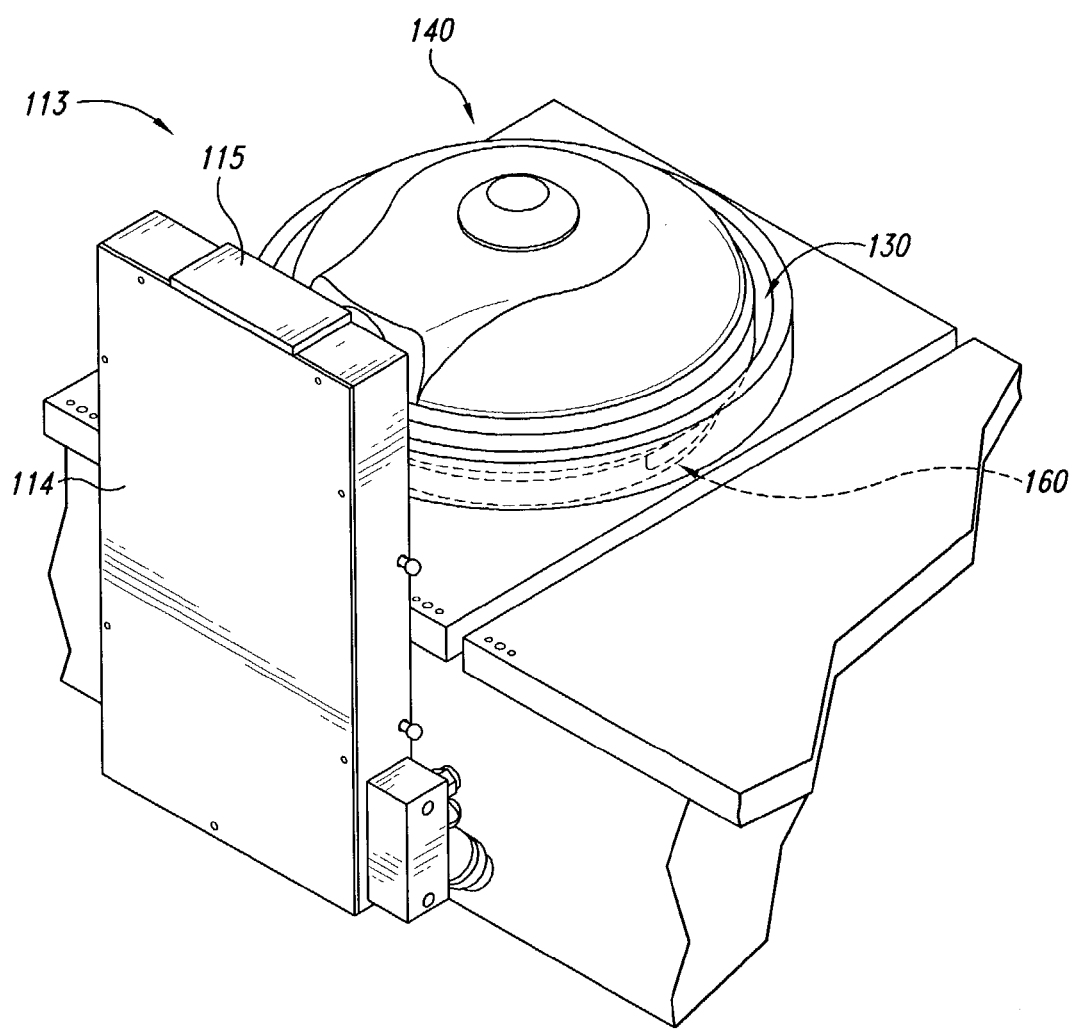
FIG. 3 is a rear isometric view of the lift and rotate assembly shown in FIG. 2 positioned to contact the microfeature workpiece with a processing liquid.

FIG. 3 illustrates the lift and rotate assembly 113 with the support member 140 rotated to its downward facing position and lowered into the vessel 130. Accordingly, the support member 140 contacts the microfeature workpiece 101 (not visible in FIG. 3) with the processing liquid in the vessel 130.

In one embodiment, the support member 140 includes a contact assembly 160 having electrical contacts for electrolytically processing the microfeature workpiece 101. In one aspect of this embodiment, the electrical contacts are cathodes for attracting conductive material to the microfeature workpiece 101, as described in greater detail below with reference to FIGS. 4 and 5.

Figure 4:
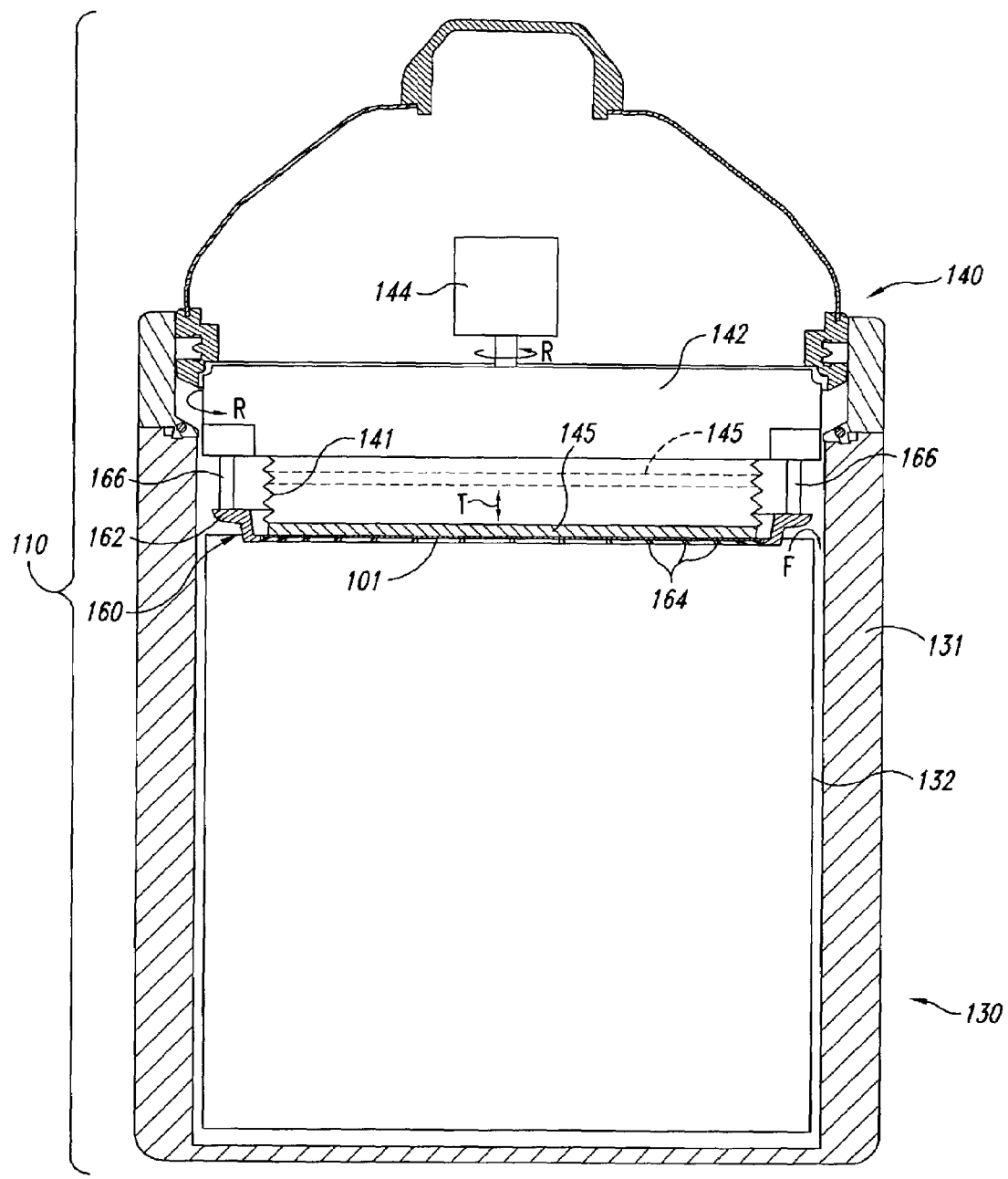
FIG. 4 is a cross-sectional view of an electroprocessing station having a processing chamber for use in an electroprocessing machine in accordance with an embodiment of the invention.

FIG. 4 illustrates a partially schematic, cross-sectional view of an embodiment of the processing station 110. The support member 140 includes a spin motor 144 and a rotor 142 coupled to the spin motor 144. The rotor 142 supports the contact assembly 160. In one aspect of this embodiment, the rotor 142 has a backing plate 145 and a seal 141. The backing plate 145 moves transverse to a workpiece 101 (arrow T) between a first position (shown in solid lines in FIG. 4) in which the backing plate 145 contacts a backside of the workpiece 101 and a second position (shown in broken lines in FIG. 4) in which it is spaced apart from the backside of the workpiece 101.

In a further aspect of this embodiment, the contact assembly 160 has a carrier 162, a plurality of contacts 164 carried by the carrier 162, and a plurality of shafts 166 extending between the carrier 162 and the rotor 142. The contacts 164 can be ring-type spring contacts or other types of contacts that are configured to engage a portion of the seed-layer on the workpiece 101. Commercially available support members 140 and contact assemblies 160 can be used in the processing station 110. Particular suitable support members 140 and contact assemblies 160 are disclosed in U.S. Pat. Nos. 6,228,232 and 6,080,691 and in U.S. application Ser. Nos. 09/385,784; 09/386,803; 09/386,610; 09/386,197; 09/501,002; 09/733,608; and 09/804,696, all of which are herein incorporated by reference.

In one embodiment, the vessel 130 includes an outer housing or chamber 131 (shown schematically in FIG. 4) and an inner chamber 132 (also shown schematically in FIG. 4) disposed within the outer chamber 131. The inner chamber 132 carries at least one electrode (not shown in FIG. 4) and directs a flow of processing liquid to the workpiece 101. The processing liquid flows over a weir (as indicated by arrow F) and into the outer chamber 131, which captures the processing liquid for recirculation, recycling or disposal.

In operation, the support member 140 holds the workpiece 101 at a workpiece-processing site (such as a workpiece plane) of the vessel 130 so that at least a plating surface of the workpiece 101 engages the processing liquid. An electrical field is established in the processing liquid by applying an electrical potential between the plating surface of the workpiece 101 and one or more electrodes (described in greater detail below with reference to FIG. 5) positioned in the inner vessel 132. For example, in one process the contact assembly 160 is biased with a negative potential with respect to the electrode(s) in the inner chamber 132 to plate conductive materials onto the workpiece 101. In one aspect of this process, one of the electrodes (a "thieving" electrode) is also biased with a negative potential with respect to the other electrodes to control the uniformity with which materials are applied to the workpiece 101.

Figure 5:
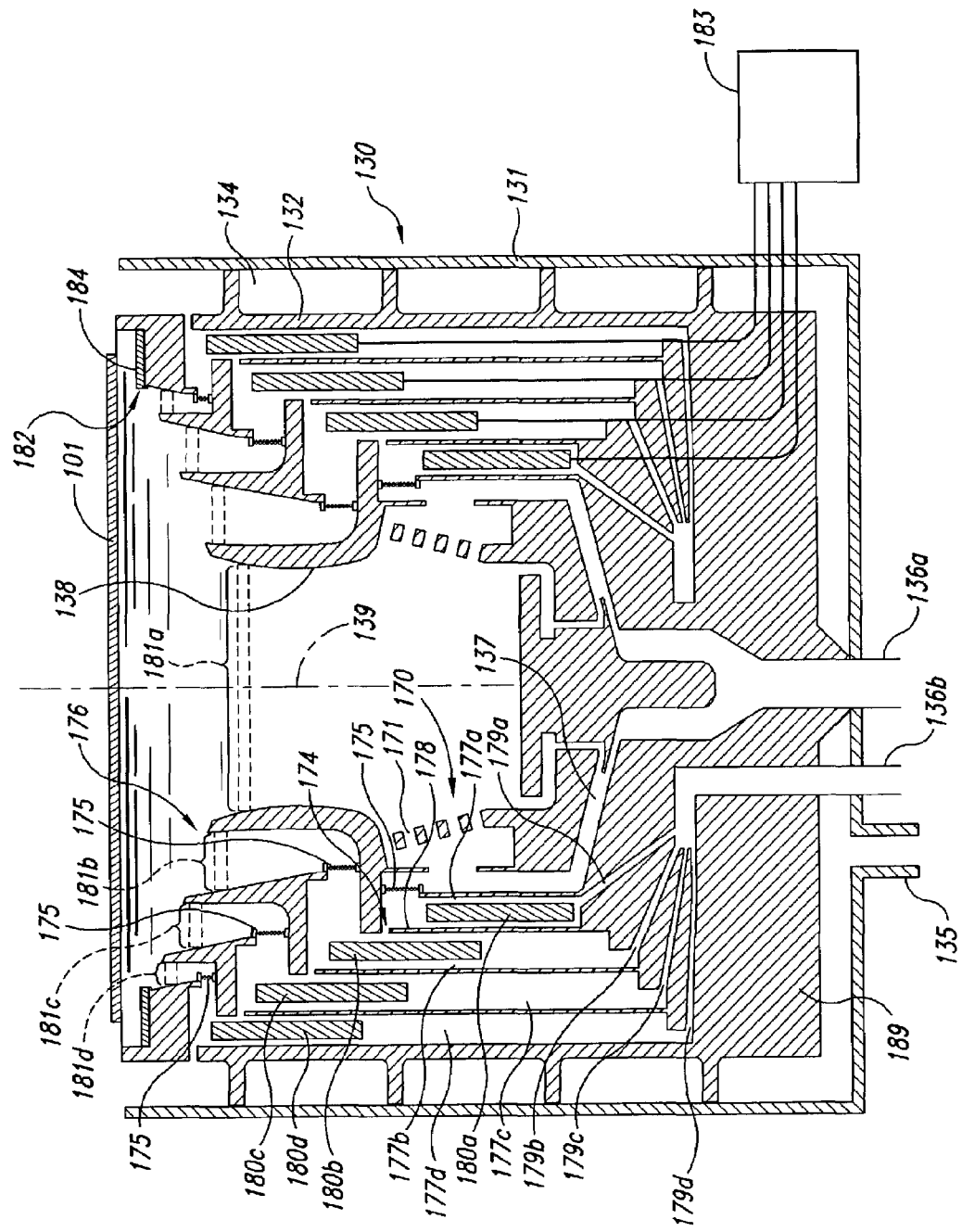
FIG. 5 is a cross-sectional view of a portion of a processing chamber in accordance with an embodiment of the invention.

FIG. 5 is a schematic illustration of an embodiment of the vessel 130 having multiple electrodes, including a thieving electrode, in accordance with an embodiment of the invention. In one aspect of this embodiment, the vessel 130 includes a helical drain channel 134 between the inner chamber 132 and the outer chamber 131. The drain channel 134 receives processing liquid overflowing the inner chamber 132 and guides the processing liquid toward a liquid outlet 135. Liquid enters the inner chamber 132 through a primary inlet 136a and a secondary inlet 136b. The primary inlet 136a is coupled to a primary flow channel 137 that directs a portion of the processing liquid within the inner chamber 132 to a primary flow guide 170. The primary flow guide 170 includes apertures 171 that direct the flow toward a central axis 139 of the inner chamber 132. The flow then proceeds upwardly from the primary flow guide 170 toward the microfeature workpiece 101.

In one embodiment, the secondary inlet 136b is coupled to a distributor 189 that directs the secondary liquid to a plurality of electrodes. In one aspect of this embodiment, the inner chamber 132 includes four concentric electrodes 180 (shown in FIG. 15 as electrodes 180a–180d). A controller 183 is operatively coupled to the electrodes 180a–d to individually control the current applied to each electrode, and accordingly control the corresponding conductive paths between the electrodes and the microfeature workpiece 101.

In a further aspect of this embodiment, the electrodes 180 are housed in a field shaping unit 176 having a corresponding plurality of electrode compartments 177 (shown as compartments 177a–177d) separated by partitions 178. The distributor 189 directs the secondary liquid into each compartment 177 via a corresponding plurality of distributor channels 179 (shown as distributor channels 179a–179d). Accordingly, the secondary liquid proceeds through the distributor 189, past the electrodes 180, and upwardly toward the microfeature workpiece 101. The effect of the field shaping unit 176 on the electrical field produced by the electrodes 180 is as if the electrodes 180 were positioned at the exits of each compartment 177, as shown by virtual electrode positions 181a–181d.

The primary flow guide 170 forms an inwardly facing vessel wall 138 (indicated in dashed lines in FIG. 5) that extends upwardly and outwardly from the primary fluid inlet 136a. A shield 184 having an aperture 182 can be positioned between the electrodes 180 and the microfeature workpiece 101 to control the interaction between the microfeature workpiece and the electrical field within the vessel 130.

In one aspect of an embodiment of the vessel 130 shown in FIG. 5, each compartment 177 has one or more apertures 174 (e.g., holes and/or slots) through which liquid and gas bubbles pass. Accordingly, gas bubbles trapped in each compartment 177 proceed radially outwardly through the apertures 177 of each compartment until they exit the inner chamber 132. In another aspect of this embodiment, each compartment 177 includes an interface member 175 (which is eliminated in another embodiment). In one aspect of this embodiment, the interface members 175 include a filter or other element configured to trap air bubbles and particulates, while allowing the secondary liquid to pass toward the microfeature workpiece 101. In another embodiment, the interface members 175 include ion membranes that allow ions to pass toward the microfeature workpiece 101, while preventing or substantially preventing the secondary fluid from passing toward the microfeature workpiece 101. Instead, the secondary fluid passes through the apertures 174 and out of the inner chamber 132 via the helical drain channel 134. The first fluid can be collected at a separate drain (not shown). In still another embodiment, the ion membrane allows the fluid as well as ions to pass through.

In one embodiment, the three innermost electrodes (180a–180c) operate as anodes and the outermost electrode 180d operates as a cathode or "current thief." Accordingly, the outermost electrode 180d attracts conductive material that would otherwise be deposited on the microfeature workpiece 101. By controlling the relative current applied to the outermost electrode/current thief 180d, the vessel 130 controls the current distribution across the face of the workpiece 101 and therefore the uniformity with which conductive material is applied to the microfeature workpiece 101. In a further aspect of this embodiment, the contour of the vessel wall 138 is selected and/or adjusted to provide further control over the current distribution. Aspects of both control methods are described in greater detail below.

Figure 6A:
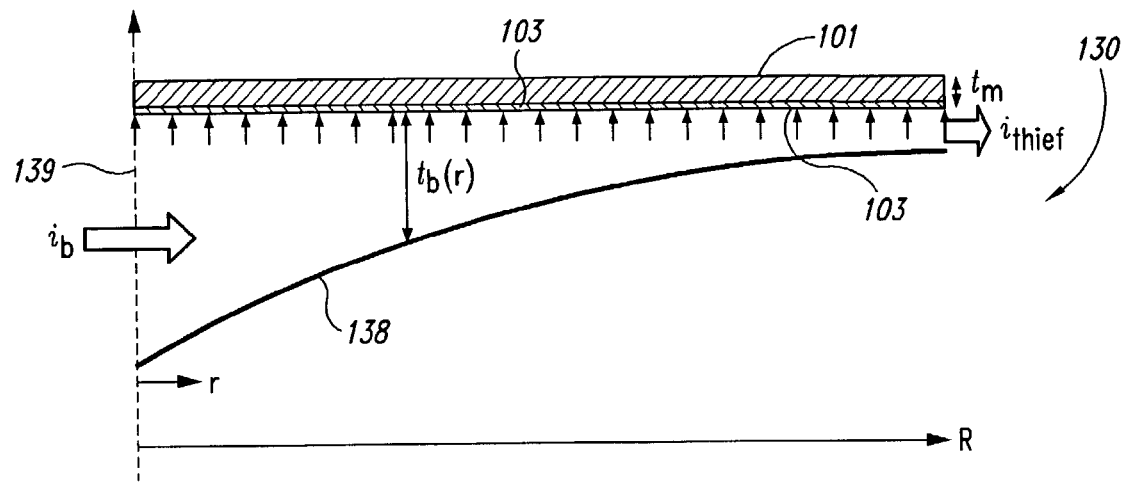
FIG. 6A is a partially schematic illustration of a quasi-one-dimensional model for a processing vessel in accordance with an embodiment of the invention.

FIG. 6A is a partially schematic illustration (with exaggerated horizontal scale) of a portion of the vessel 130 and the microfeature workpiece 101. The microfeature workpiece 101 has a conductive layer 103 and is positioned above the vessel wall 138. For purposes of this calculation, the mass transfer effects of the primary and secondary flows are neglected, and the entire vessel wall 138 is simulated as being solid. An electrolytic liquid is introduced between the vessel wall 138 and the microfeature workpiece 101, and an electrical current passes through the electrolytic liquid between the workpiece 101 and the electrodes 180 (not shown in FIG. 6A). The variations in the electrical potential in the conductive layer 103 and the electrolytic liquid are governed by the following equations:

$$\frac{1}{r}\frac{d}{dr}\left(\frac{rt_b(r)}{\rho_b}\frac{d\phi_b}{dr}\right) = \bar{i} \quad [1]$$

$$\frac{1}{r}\frac{d}{dr}\left(\frac{r}{\rho_m}\frac{d\phi_m}{dr}\right) = \frac{\bar{i}}{t_m} \quad [2]$$

where:

r=radial distance from the vessel centerline 139

$t_b$=distance between the microfeature workpiece 101 and vessel wall $\rho_b$=electrolytic liquid (bath) resistivity $\rho_m$=conductive layer (metal) resistivity $\phi_b$=electrical potential in the electrolytic liquid $\phi_m$=electrical potential in conductive layer 103

$t_m$=thickness of the conductive layer 103

$\bar{i}$=workpiece current density.

Assuming a uniform current density at the conductive layer 103 (e.g., $\bar{i}$=constant), Equation 2 is solved for $\phi_m$. The potential in the electrolytic liquid ($\phi_b$) is then determined from the interface kinetics as follows:

$$\phi_b = \phi_m + \frac{RT}{nF}\ln(\bar{i}/i_o) = \phi_m + \text{constant} \quad [3]$$

where $i_o$=anode/cathode equilibrium exchange current density.

Equation 1 is then solved for $t_b$ (r) as follows:

$$t_b(r) = \left(\frac{R}{r}\right)^2 t_b(R) + \frac{\rho_b}{\rho_m}t_m\left[\left(\frac{R}{r}\right)^2 - 1\right] \quad [4]$$

where R=outermost radius of vessel wall 138.

The expression for $t_b(r)$ is (a) inversely proportional to $r^2$, the radial distance from the vessel centerline 139, and (b) independent of the applied workpiece current, $i_w$ (which is equal to $\bar{i}$ times the area of the microfeature workpiece 101). In actual application, providing a surface with t(b) inversely proportioned to $r^2$ is practical only for values of r above a selected value, or the contour of the vessel wall becomes unwieldy. This is also the region where the terminal effect (which the thief current can at least partially correct) is likely most prevalent.

Equation 4 is then substituted back into Equation 1 and the current in the electrolytic liquid ($i_b$) is solved to obtain:

$$\frac{i_b}{i_w} = 1 + \frac{\rho_m}{\rho_b}\frac{t_b(R)}{t_m} \quad [5]$$

Assuming that the bath current $i_b$ is the sum of the workpiece current $i_w$ and the thief current $i_{thief}$, the following expression for $i_{thief}$ obtains:

$$i_{thief} = i_w\left(\frac{\rho_m}{\rho_b}\frac{t_b(R)}{t_m}\right) \quad [6]$$

As seen from Equation 6, $i_{thief}$ can be proportional to $\rho_m$ and/or $t_b$, and/or can be inversely proportional to $\rho_b$ and/or $t_m$. Equations 4 and 6 define, respectively, (a) the contour of a vessel wall 138 and (b) the current to be applied to the current thief 180d (FIG. 5) to provide a uniform current density across the conductive layer 103.

In one embodiment, assuming:

R=0.1 meters $t_b$(R)=0.005 meters $t_m$=500 Å

$\rho_m$=30 μohm-centimeters $\rho_b$=5.9×10$^6$ μohm-centimeters, $i_w$=1 Amp,

Equation 6 indicates that the thief current ($i_{thief}$) should be about 0.51 amps.

Figure 6B:
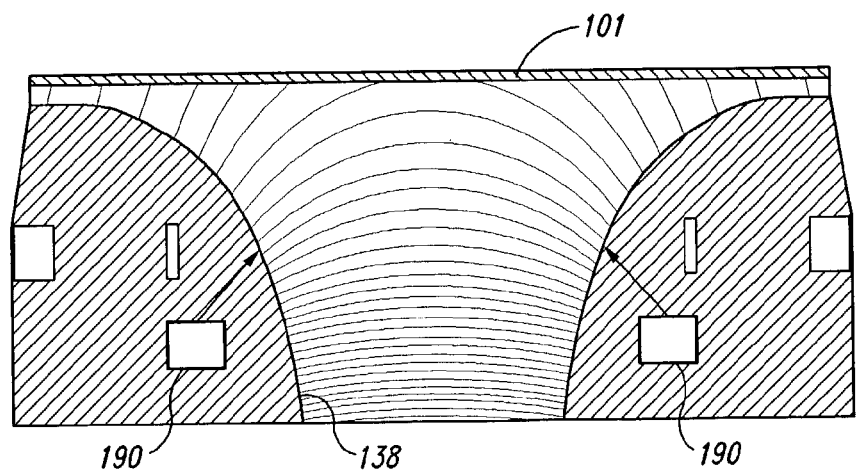
FIG. 6B is a partially schematic, cross-sectional view of a portion of a processing chamber illustrating electropotential contours resulting from a two-dimensional simulation in accordance with an embodiment of the invention.

FIG. 6B illustrates the electrical potential lines obtained from a two-dimensional, axisymmetric simulation of an electrolytic process for which the contour of the vessel wall 138 is obtained by solving Equation 4 above assuming the above values for R, $t_b$, $t_m$, $\rho_m$, and $\rho_b$. As indicated by the curvature of the electrical potential contours, the two-dimensional analysis predicts two-dimensional results, at least at some distance away from the edge of the wafer.

Figure 7A:
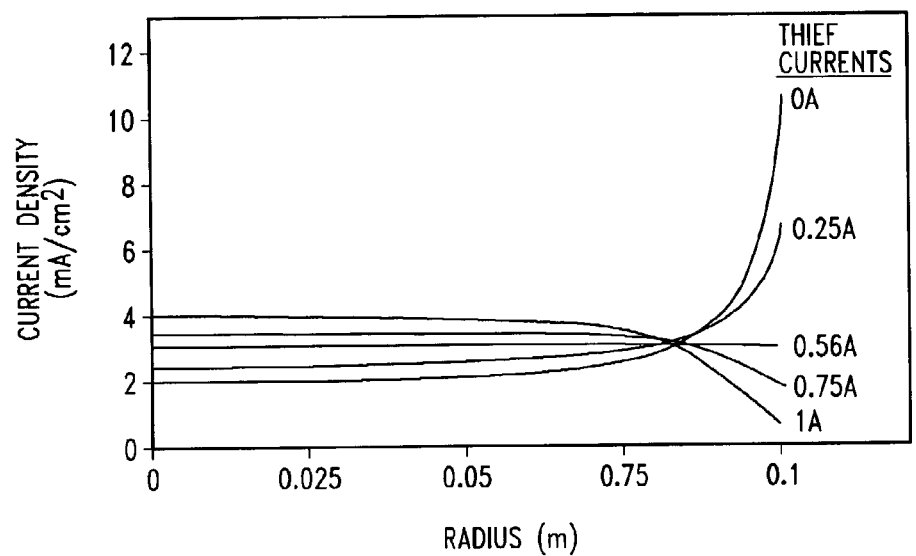
FIGS. 7A–7C illustrate further results obtained from the simulation illustrated in FIG. 6B.

FIG. 7A is a graph illustrating the predicted current density at the surface of the microfeature workpiece 101 for a variety of thief currents using a two-dimensional simulation generally similar to that described above with reference to FIG. 6B. A workpiece current $i_w$ of 1 amp is also assumed. FIG. 7A illustrates that, under these conditions, the optimum current density occurs at a thief current $i_{thief}$ of about 0.56 amps. At a thief current $i_{thief}$=0.56 amps (e.g., about 55% of the workpiece current $i_w$), the predicted current density nonuniformity is approximately 3.85% (3-σ value). This prediction is within about 10 percent of the value predicted by the one-dimensional expression of Equation 6 (which predicted $i_{thief}$=0.51 amps) and this difference can likely be attributed to the two-dimensional effects visible in FIG. 6B.

Figure 7B:
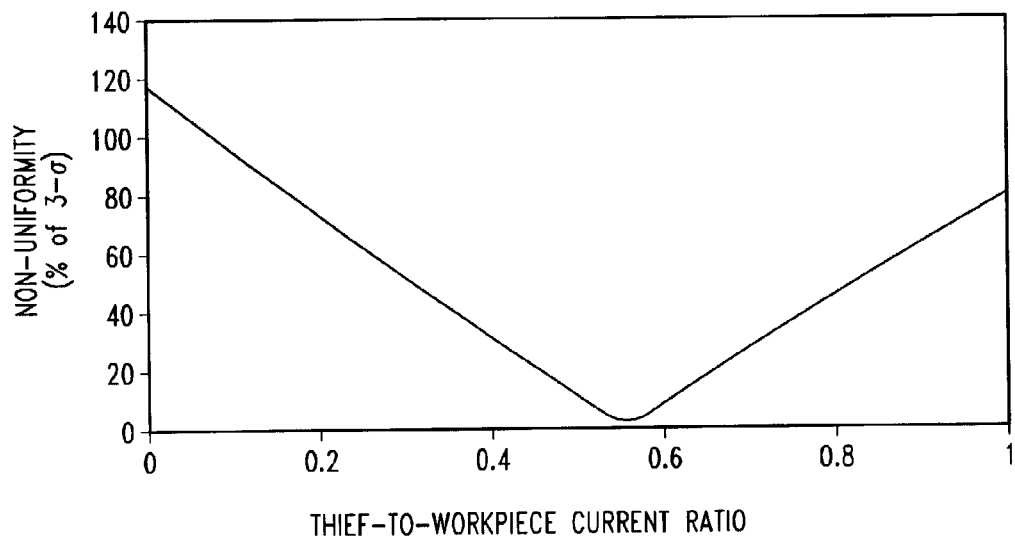
Figure 7C:
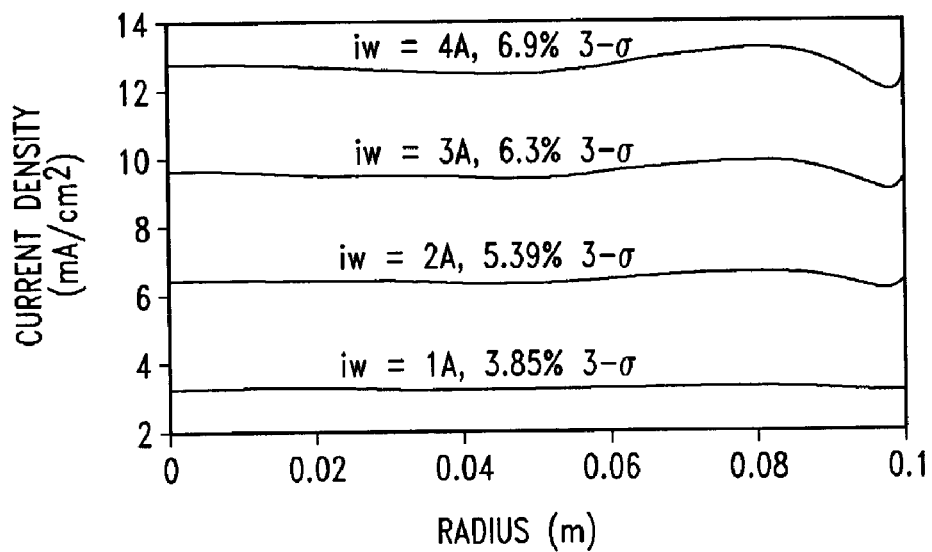

FIG. 7B illustrates that the predicted nonuniformity of the current density is about 3.85% (3-σ value) at a thief-to-workpiece current ratio of about 0.56. FIG. 7C illustrates the predicted effect of increasing the total workpiece current $i_w$ from 1 amp to 4 amps while the ratio of the thief current $i_{thief}$ to the workpiece current $i_w$ is fixed at a value of 0.56. FIG. 7C also illustrates that the current density uniformity (i.e., the flatness of the curves shown in FIG. 7C) is relatively insensitive to increasing total wafer current, so long as the ratio of the thief current $i_{thief}$ to the workpiece current $i_w$ is maintained at approximately the predicted optimum level of 0.56.

One feature of the foregoing embodiments described above with reference to FIGS. 5–7C is that the thief current $i_{thief}$ is selected to improve the uniformity with which material is deposited onto the microfeature workpiece 101. In one aspect of this embodiment, the thief current $i_{thief}$ is adjusted independently of the current applied to the electrodes 180a–180c to adjust the ratio of the thief current $i_{thief}$ to the workpiece current $i_w$, again to increase the uniformity with which material is deposited onto the microfeature workpiece 101. In another embodiment, both the total current applied to the processing liquid and the current ratio are changed. In one aspect of either embodiment, the thief current (and/or current ratio) is changed during the processing of a given workpiece 101, for example, as the thickness of the conductive layer 103 increases and the terminal effect decreases. In other embodiments (for example, during patterned plating or other plating operations that do not significantly alter the resistivity of conductive layer 103) the thief current (and/or current ratio) can remain approximately constant during processing. In another aspect of these embodiments, the thief current (and/or current ratio) is changed from one workpiece 101 to the next to account for differences in the initial conditions of different workpieces.

In another embodiment, the current density at the surface of the microfeature workpiece 101 (and therefore, the uniformity with which conductive material is applied to the microfeature workpiece 101) is controlled by controlling the shape of the vessel wall 138. For example, in one particular embodiment, the contour of the vessel wall 138 is fixed and is based on the expected thickness ($t_m$) of the applied conductive layer 103, the resistivity ($\rho_m$) of the conductive material, the resistivity ($\rho_b$) of the electrolytic liquid, and the offset distance ($t_b$) between the vessel wall 138 and the microfeature workpiece 101.

In another embodiment, the vessel wall 138 is changed when any of the foregoing parameters changes by at least a selected amount. For example, in one embodiment, the vessel wall 138 includes one or more flexible surface segments coupled to one or more actuators 190 (two are shown schematically in FIG. 6B) that are controllable to produce any of a wide variety of shapes. In one aspect of this embodiment, the controller 183 described above with reference to FIG. 5 controls the action of the actuators 190 and in another embodiment, another controller handles this task. In a further aspect of either embodiment, the actuators 190 change the shape of the vessel wall 138 dynamically (e.g., during processing of a given workpiece 101) and/or during an interval between processing two workpieces 101. In still another embodiment, a vessel wall 138 having one contour is exchanged for another vessel wall 138 having a different contour when any of the foregoing parameters changes by at least a selected amount. In yet another embodiment, a tool, such as the tool 100 described above with reference to FIG. 1, includes a plurality of vessels, each having a vessel wall 138 tailored to a particular combination of the parameters described above. In any of these embodiments, the contour of the vessel wall 138 can be selected and/or adjusted to produce a uniform current density at the surface of the microfeature workpiece 101.

In a further aspect of the embodiments described above with reference to FIGS. 5–7C, the current applied to the electrodes 180a–180c is independently adjusted. Independently adjusting these currents can have the same effect as small changes in the contour of the vessel wall 138. Accordingly, in one embodiment, the current supplied to the electrodes 180a–180c is adjusted in addition to or in lieu of changing the contour of the vessel wall 138.

In still further embodiments, the effective contour of the vessel wall 138 relative to the microfeature workpiece 101 is altered in other manners. For example, in one embodiment, the separation between the vessel wall 138 and the microfeature workpiece 101 can be increased or decreased by a constant value across the diameter of the wafer by raising or lowering the support member 140 (FIG. 4). In one aspect of this embodiment, the microfeature workpiece 101 is raised or lowered while it is being processed. In another aspect of this embodiment, the support member 140 can be positioned at different elevations for different microfeature workpieces. In any of these embodiments, the range of vertical travel of the microfeature workpiece 101 is approximately equal to the thickness of the workpiece when it is desired to keep the backside of the workpiece above the processing liquid. This range may be larger when the wafer is being rotated. When the backside of the workpiece 101 is protected or can acceptably be immersed in the processing liquid, this range can be increased.

In other embodiments, the vessel wall 138 has different contours and the thief current $i_{thief}$ has corresponding different values. For example, in one embodiment, the vessel wall 138 includes a flat, conically inclined surface with an inclination angle of $\theta$ relative to horizontal. Accordingly, t(b) is proportional to r. The anode current flux as a function of r is given by the following expression:

$$i_a(r) = i_w \left[ 1 + \frac{\rho_m}{\rho_b} \frac{H + 2R\tan\theta - \frac{3\tan\theta}{2} r}{t} \right] \quad [7]$$

where H=the offset between the outer edge of the workpiece and the vessel wall.

This target radial current distribution can be roughly approximated in operation with a single anode or more closely approximated with a plurality of anodes. Integrating this expression to obtain the total current in the bath, $i_b$, the following expression obtains:

$$i_b = i_w \left[ 1 + \frac{\rho_m}{\rho_b} \frac{H + R\tan\theta}{t_m} \right] \quad [8]$$

Because $i_{thief} = i_b - i_w$ $$i_{thief} = i_w \left[ \frac{\rho_m}{\rho_b} \frac{H + R\tan\theta}{t_m} \right] \quad [9]$$

The foregoing expressions indicate that a non-zero thief current is required to maintain a constant current flux for any non-zero bath current (supplied by a single or multiple anode arrangement) for which $i_b > i_w$. It is believed that increasing the bath current beyond $i_w$ can increase the uniformity with which conductive materials are applied to the microfeature workpiece 101. Providing a thief enables this current increase.

In a particular embodiment for which $\theta=0$ (i.e., for which the vessel wall 138 is flat and horizontal), equation [9] reduces to the following:

$$i_{thief} = i_w \left[ \frac{\rho_m}{\rho_b} \frac{H}{t} \right] \quad [10]$$

In one processing method, as the thickness of the metal layer on the workpiece 101 increases, the thief current $i_{thief}$ can be decreased. Alternatively, $i_{thief}$ can be held constant or can decrease at a slower rate by increasing H (i.e., by moving the vessel wall 138) during processing. In particular embodiments, $i_{thief}$ can be proportional to $\rho_m$ and/or H, and/or can be inversely proportional to $\rho_b$ and/or $t_m$.

In other embodiments, the contour of the vessel wall 138 can have other monotonically curved shapes. For example, $t_b$ can vary as $1/r^x$ (for a wall that curves toward the outer edge of the microfeature workpiece 101) or $r^x$ (for a wall that curves away from the outer edge of the microfeature workpiece 101)—in the general case, $t_b$ can vary as $r^x$ where $x \neq 0$. For example, in a particular embodiment described above with reference to Equation [4], $t_b$ can vary as $r^{-2}$.

In one aspect of the foregoing embodiments described above with reference to FIGS. 5–7C, the contour of the vessel wall 138, the current applied to the electrodes 180a–180c, and/or the current applied to the thief electrode 180d are adjusted to produce a generally uniform current density across the surface of the microfeature workpiece 101. In another aspect of these embodiments, the bath resistivity $\rho_b$ is adjusted. In yet another aspect of these embodiments, the current applied to the electrodes 180a–180c and/or the thief electrode 180d can be adjusted (e.g., by the controller 183 described above with reference to FIG. 5) to account for changes in the characteristics of the microfeature workpiece W (e.g., the thickness of the metal layer), the contour of the wall 138, and/or the bath resistivity. In another aspect of these embodiments, one or more of these variables are adjusted to deliberately produce a nonuniform current density across the surface of the microfeature workpiece 101. Accordingly, some or all aspects of the processes can be used to compensate for nonuniformities that result from earlier process steps and/or to provide a conductive layer 103 having a particular (nonuniform) thickness profile. For example, this method can be used to provide a conductive layer 103 having a dished (e.g., edge thick) profile or a domed (e.g., edge thin) profile. In other embodiments, the foregoing methods are used to produce conductive layers 103 having other nonuniform characteristics. In still further embodiments, the uniformity of the current distribution at the surface of the microfeature workpiece can be controlled by selecting the appropriate combination of processing liquid resistivity and vessel surface contour.

One feature of at least some of the foregoing embodiments is that a diffuser, which is typically included in existing processing chambers need not be included in the vessel 130. An advantage of this arrangement is that the uniformity obtained from one vessel can more closely match that of another vessel because it is easier to closely control the current applied to the electrodes 180a–d than it is to control the physical characteristics (such as hole size and spacing) of a diffuser. Another advantage of this arrangement is that it is easier to adjust the current density by adjusting the currents to each of the electrodes than by adjusting the vertical spacing between the diffuser and the microfeature workpiece 101. For example, it can be difficult with existing diffuser arrangements to adjust the position of the diffuser without allowing flow and/or current leakage around the edges of the diffuser, which can adversely affect the current distribution of the workpiece 101.

Figure 8:
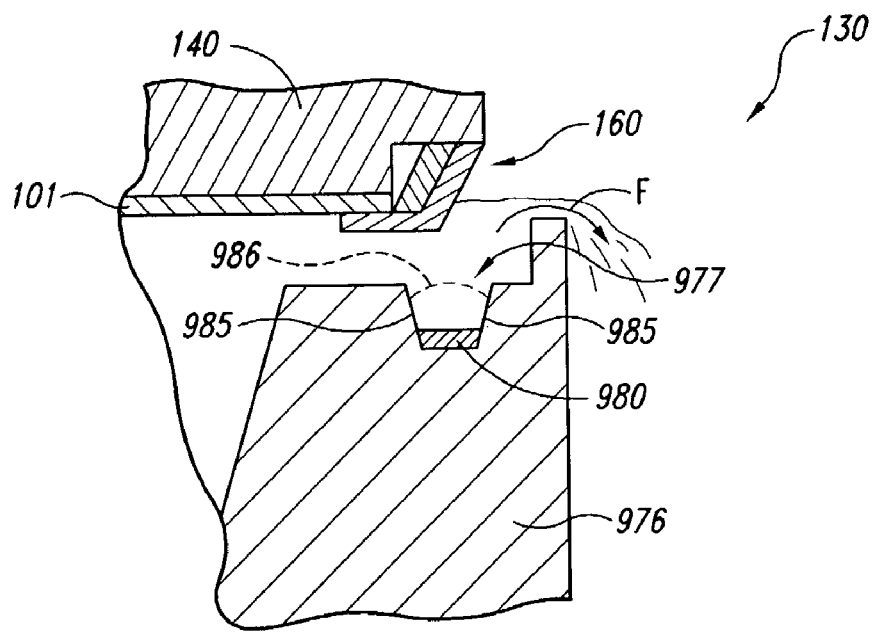
FIG. 8 is a partially schematic illustration of a portion of a processing chamber having an electrode positioned in accordance with an embodiment of the invention.

In one aspect of the foregoing embodiments, the current thief has a configuration generally similar to that of the other electrodes (which act as anodes rather than cathodes). In other embodiments, the current thief has other configurations. For example, in one embodiment shown schematically in FIG. 8, the vessel 130 includes a current thief 980 positioned in an electrode compartment 977 beneath the microfeature workpiece 101. For purposes of illustration, additional electrode(s) (e.g., anode(s)) positioned inward of the current thief 980 are not shown in FIG. 8. In one aspect of this embodiment, the electrode compartment 977 has upwardly and outwardly canted sidewalls 985. An advantage of this feature is that once conductive material 986 builds up on the current thief 980, the current thief 980 (with the conductive material 986 attached) can be easily removed by lifting it out of the compartment 977. Accordingly, the current thief 980 can be replaced from above without disassembling the unit 976 in which it is housed. In another embodiment, the current thief 980 can be positioned external to the vessel 130 and can remain in fluid communication with the vessel 130 via a conduit or channel.

Figure 9A:
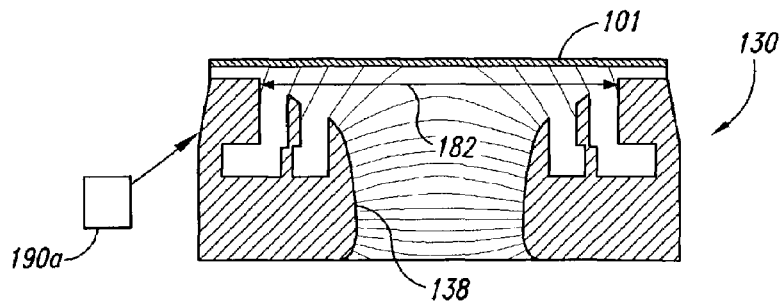
FIGS. 9A–9C illustrate a portion of a vessel having a movable shield and corresponding predicted current distributions in accordance with another embodiment of the invention.
Figure 9B:
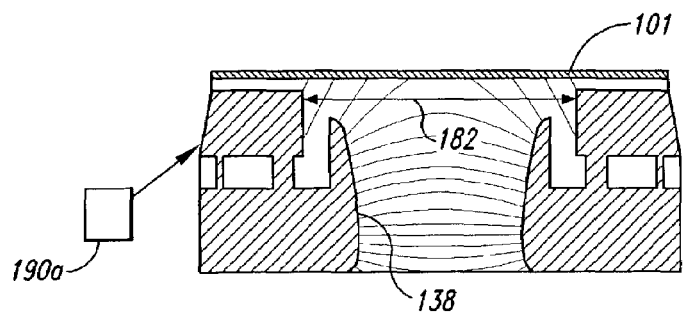
Figure 9C:
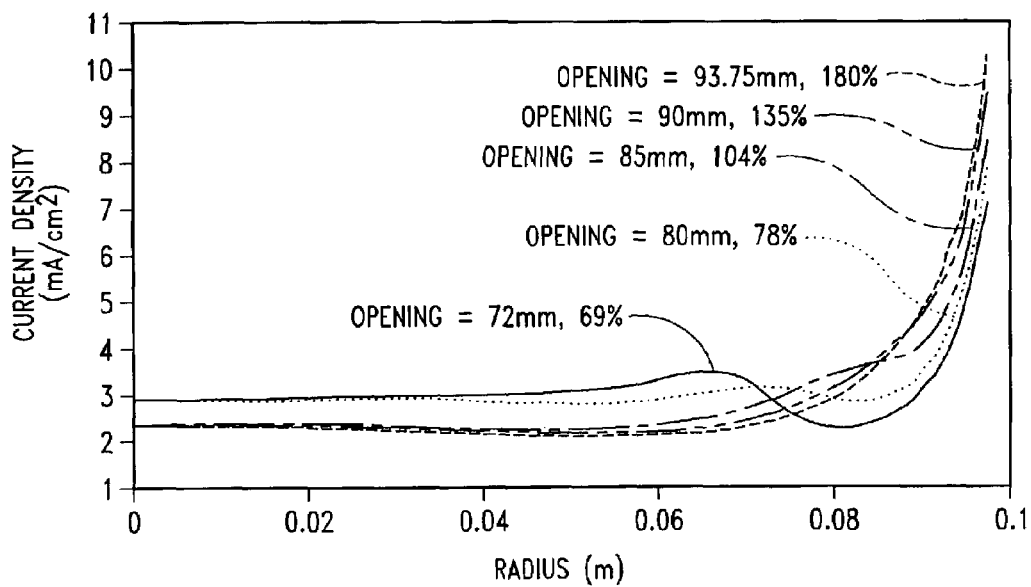

In other embodiments, other techniques are used to control the uniformity with which material is applied to the microfeature workpiece. For example, FIGS. 9A–9C illustrate two-dimensional simulation results predicting current uniformity obtained by controlling the size of the opening 182 through the shield 184 described above with reference to FIG. 5, with a 500 Å thick tantalum barrier layer and with 1 Amp applied current. Such a technique can be used in addition to or in lieu of controlling the contour of the vessel wall 138 or the thief current. FIG. 9A illustrates electrical potential contours for a shield opening 182 of 187.5 millimeters, and FIG. 9B illustrates predicted electrical potential contours for a shield opening of 144 millimeters. FIG. 9C graphically illustrates the current density as a function of radial position on a 200 mm microfeature workpiece 101 for several shield opening sizes. The overall uniformity (as a percentage of a 3-$\theta$ value) is also indicated for each opening size. The uniformity of the current density at the microfeature workpiece 101 improves by reducing the size of the opening 182 through the shield 184, but at an opening of 144 millimeters the resulting uniformity was 69% (3-$\theta$ value). Accordingly, in this particular embodiment, reducing the size of the shield opening 182 by a substantial amount does not produce results as favorable as those predicted for the simulation described above with reference to FIG. 6. However, this approach may be suitable for instances in which it is desired to improve the uniformity from existing arrangements without necessarily improving the uniformity to the levels described above with reference to FIGS. 7A–7C.

In one aspect of the embodiments described above with reference to FIGS. 9A–9C, one or more actuators 190a control the size of the shield opening 182. In a further aspect of one embodiment, an actuator 190a is coupled to a controller (e.g., the controller 183 described above with reference to FIG. 5A, or another controller) to direct the activation of the actuator 190a. In yet a further aspect of these embodiments, the actuator 190a changes the size of the opening 182 dynamically (e.g., during processing of a given workpiece 101) and/or during an interval between processing two workpieces 101.

From the foregoing, it will be appreciated that specific embodiments of the invention have been described herein for purposes of illustration, but that various modifications may be made without deviating from the spirit and scope of the invention. For example, some or all of the variable parameters described above can be adjusted during processing (e.g., to account for changes to the microfeature workpiece as it is processed) and/or between processing sessions (e.g., to account for microfeature workpieces having different initial conditions). Selected embodiments of the invention include combinations of two or more of the features described above. For example, one combination includes a processing vessel with multiple electrodes and a dynamically changing vessel wall. In further embodiments, the vessel also includes a current thief (to which current is dynamically supplied) and/or a shield having a dynamically activated shield opening. In yet a further embodiment, the vessel wall is fixed and the thief current and shield opening change dynamically. In further embodiments, the vessel includes other combinations of features that can also be controlled to affect the uniformity with which material is applied to the workpiece 101. Accordingly, the invention is not limited except as by the appended claims.

We claim:

1. An apparatus for processing a microfeature workpiece, comprising:
   a support member configured to carry a microfeature workpiece at a workpiece plane;
   a vessel having a generally continuous, convex curved vessel surface facing toward the support member, the vessel surface extending outwardly relative to a vessel axis, wherein for each of a plurality of points on the vessel surface, a first distance between the point and the workpiece plane is proportional to a second distance between the point and the vessel axis, raised to a non-zero power; and
   a plurality of electrodes positioned at least proximate to the vessel, the electrodes being positioned to be in fluid communication with the workpiece plane.

2. The apparatus of claim 1 wherein for each of the plurality of points, a first distance between the point and the workpiece plane is inversely proportional to the square of the second distance.

3. The apparatus of claim 1 wherein the plurality of points are spaced apart from the vessel axis.

4. The apparatus of claim 1 wherein at least a first one of the electrodes is coupleable to a source of current at a first polarity and at least a second one of the electrodes is coupleable to a source of current at a second polarity opposite the first polarity.

5. The apparatus of claim 1 wherein the curved vessel surface is monotonically varying.

6. The apparatus of claim 1, further comprising:
   the microfeature workpiece, wherein the microfeature workpiece includes an exposed conductive layer having a first resistivity; and
   the processing liquid, wherein the processing liquid has a second resistivity, and wherein the first distance is proportional to a ratio of the second resistivity and the first resistivity.

7. The apparatus of claim 1 wherein the vessel is a first vessel and the vessel surface is a first vessel surface having a first contour, and wherein the apparatus further comprises a second vessel having a second vessel surface with a second contour different than the first contour.

8. The apparatus of claim 1 wherein the support member is movable relative to the vessel to change the location of the workpiece plane.

9. The apparatus of claim 1 wherein at least a portion of the vessel surface is movable to change a contour of the vessel from a first contour to a second contour different than the first contour.

10. The apparatus of claim 1 wherein the electrodes include first and second electrodes, and wherein the apparatus further comprises:
    a first conductive path coupled to the first electrode to provide a first current to the first electrode at a first polarity;
    a second conductive path coupled to the second electrode to provide a second current to the second electrode at a second polarity opposite to the first polarity; and
    at least one controller coupled to at least the second conductive path to vary the second current as a function of at least one of a resistivity of the processing liquid and the first distance.

11. The apparatus of claim 1 wherein the vessel surface is axisymmetrically disposed about the vessel axis.

12. The apparatus of claim 1 wherein the vessel surface is fixed relative to the support member.

13. The apparatus of claim 1 wherein the vessel surface is movable relative to the support member between a first configuration and a second configuration, wherein the vessel surface has a first contour when in the first configuration, and wherein the vessel surface has a second contour different than the first contour when in the second configuration.

14. The apparatus of claim 1, further comprising:
    an electrode support positioned within the vessel and having a cavity positioned to removably support at least one of the electrodes, the cavity having a first sidewall and a second sidewall canted outwardly from the first sidewall as the first and second sidewalls extend toward the support member.

15. The apparatus of claim 14 wherein the electrode support is configured to support a plurality of electrodes.

16. The apparatus of claim 14, further comprising the electrode, and wherein the electrode includes a cathode.

17. The apparatus of claim 14, further comprising:
    an input/output station positioned to receive microfeature workpieces; and
    a transfer device configured to removably carry the microfeature workpiece, the transfer device being movable relative to the input/output station and the vessel.

18. An apparatus for processing a microelectronic substrate comprising:
    a support member configured to carry a microfeature workpiece at a workpiece plane;
    a vessel having a generally continuous, convex curved vessel surface facing toward the support member and positioned to carry a processing liquid; and
    a plurality of electrodes positioned to be in fluid communication with the vessel and the workpiece plane, wherein at least a first one of the plurality of electrodes is coupleable to a source of electrical current at a first polarity and at least a second one of the plurality of electrodes is coupleable to a source of electrical current at a second polarity opposite from the first polarity.

19. The apparatus of claim 18 wherein for each of a plurality of points on the vessel surface, a first distance between the point and the workpiece plane is inversely proportional to the square of a second distance between the point and the vessel axis.

20. The apparatus of claim 18, further comprising:
    a first current transmitter electrically coupled to at least the first one of the plurality of electrodes to provide a first electrical signal with the first polarity; and
    a second current transmitter electrically coupled to at least the second one of the plurality of electrodes to provide a second electrical signal with the second polarity.

21. The apparatus of claim 18, further comprising:
    a first conductive path coupled to the first electrode to provide a first current to the first electrode at a first polarity;
    a second conductive path coupled to the second electrode to provide a second current to the second electrode at a second polarity opposite to the first polarity; and
    at least one controller coupled to at least the second conductive path to vary the second current.

22. The apparatus of claim 15, further comprising:
    a contact positioned to be in electrical communication with the workpiece plane;
    a controller coupled to the second electrode and configured to vary an electrical current applied to the second electrode while the second electrode is in fluid communication with the workpiece plane; and a shield positioned between at least one of the electrodes and the workpiece plane, wherein the shield has a variable aperture, configured to change from a first size to a second size while the second electrode is in fluid communication with the workpiece plane.

23. The apparatus of claim 22 wherein at least a portion of the vessel surface is movable relative to the support member while the support member carries a microfeature workpiece.

24. The apparatus of claim 22 wherein the vessel surface extends outwardly from a vessel axis, and wherein at least a portion of the vessel surface is movable relative to the support member while the support member carries a microfeature workpiece, further wherein in at least one configuration of the vessel surface, for each of a plurality of points on the vessel surface, a first distance between the point and the workpiece plane is proportional to a second distance between the point and the vessel axis, raised to a non-zero power.

25. An apparatus for processing a microfeature workpiece, comprising:
   support means for carrying the microfeature workpiece at a workpiece plane;
   vessel means having a generally continuous, convex curved surface facing toward the support means, the surface extending outwardly relative to a vessel axis, wherein for each of a plurality of points on the surface, a first distance between the point and the workpiece plane is proportional to a second distance between the point and the vessel axis, raised to a non-zero; and
   a plurality of electrodes positioned at least proximate to the vessel means, the electrodes being in fluid communication with the workpiece plane.

26. The apparatus of claim 25 wherein at least a portion of the vessel surface is movable to change a contour of the vessel surface from a first contour to a second contour different than the first contour.

27. The apparatus of claim 25 wherein the vessel surface is fixed relative to the support member.

28. An apparatus for processing microfeature workpieces, comprising:
   an input/output station positioned to receive microfeature workpieces; and
   a processing station including:
      a support member configured to carry a microfeature workpiece at a workpiece plane;
      a vessel having a generally continuous, convex curved vessel surface facing toward the support member, the vessel surface extending outwardly relative to a vessel axis, wherein for each of a plurality of points on the vessel surface, a first distance between the point and the workpiece plane is proportional to a second distance between the point and the vessel axis, raised to a non-zero power; and
      a plurality of electrodes positioned at least proximate to the vessel, the electrodes being positioned to be in fluid communication with the workpiece plane, wherein at least a first one of the electrodes is coupleable to a source of current at a first polarity and at least a second one of the electrodes is coupleable to a source of current at a second polarity opposite the first polarity.

29. The apparatus of claim 28 wherein the vessel is a first vessel and has a first vessel surface with a first contour, and wherein the apparatus further comprises a second vessel positioned at least proximate to the first vessel and having a second contour different than the first contour.

30. The apparatus of claim 28, further comprising a transfer device configured to removably carry the microfeature workpiece, the transfer device being movable relative to the input/out station and the processing station.

31. The apparatus of claim 28 wherein at least a portion of the vessel surface is movable to change a contour of the vessel from a first contour to a second contour different than the first contour.

32. An apparatus for processing a microfeature workpiece, comprising:
   a support member configured to carry a microfeature workpiece at a workpiece plane;
   a vessel having a generally continuous, convex curved vessel surface facing toward the support member the curved vessel surface providing an at least approximately uniform current density at the workpiece plane; and
   at least one electrode disposed within the vessel and coupleable to a source of electrical current.

33. The apparatus of claim 32 wherein the vessel surface extends outwardly from a vessel axis, and wherein for each of a plurality of points on the vessel surface, a first distance between the point and the workpiece plane is inversely proportional to the square of a second distance between the point and the vessel axis.

34. The apparatus of claim 32 wherein the first distance is proportional to the second distance, raised to a non-zero power.

35. The apparatus of claim 32, further comprising:
   an input/output station positioned to receive microfeature workpieces; and
   a transfer device configured to removably carry the microfeature workpiece, the transfer device being movable relative to the input/output station and the vessel.

36. An apparatus for processing a microfeature workpiece, comprising:
   a support member configured to carry a microfeature workpiece at a workpiece plane;
   a contact positioned in electrical communication with the workpiece plane;
   a vessel having a generally continuous, convex curved vessel surface facing at least partially toward the support member, at least a portion of the vessel surface being movable relative to the support member while the support member carries a microfeature workpiece; and
   a plurality of electrodes spaced apart from the workpiece plane and positioned in fluid communication with the workpiece plane, the plurality of electrodes being coupleable to at least one source of electrical potential.

37. The apparatus of claim 36, further comprising a controller coupled to the plurality of electrodes, the controller being configured to control a current applied to at least one of the plurality of electrodes while the microfeature workpiece is at the workpiece plane.

38. The apparatus of claim 36 wherein the vessel surface extends outwardly from a vessel axis, and wherein in at least one configuration of the vessel surface, for each of a plurality of points on the vessel surface, a first distance between the point and the workpiece plane is proportional to a second distance between the point and the vessel axis, raised to a non-zero power.

39. The apparatus of claim 36 wherein at least a first one of the electrodes is coupleable to a source of current at a first polarity and at least a second one of the electrodes is coupleable to a source of current at a second polarity opposite the first polarity and wherein the apparatus further includes a controller configured to vary an electrical current applied to at least one of the first and second electrodes while a microfeature workpiece is carried at the workpiece plane.

40. The apparatus of claim 36 wherein least a first one of the electrodes is coupleable to a source of current at a first polarity and at least a second one of the electrodes is coupleable to a source of current at a second polarity opposite the first polarity, and wherein the second electrode is positioned to attract at least a portion of a conductive material in the processing liquid that would otherwise attach to the microfeature workpiece, further wherein the apparatus further comprises a controller configured to vary an electrical current applied to the second electrode while the microfeature workpiece is in fluid communication with the second electrode.

41. The apparatus of claim 36, further comprising a shield having an aperture and being positioned between at least one of the electrodes and the workpiece plane and wherein the shield is operatively coupled to an actuator to change a size of the aperture from a first size to a second size while the at least one electrode is in fluid communication with the workpiece plane.

42. A method for forming a vessel for electrolytic processing, comprising:
providing a support member to carry a microfeature workpiece at a workpiece plane;
forming a vessel having a generally continuous, convex curved vessel surface extending outwardly relative to a vessel axis, wherein for each of a plurality of points on the vessel surface, a first distance between the point and the workpiece plane is proportional to a second distance between the point and the vessel axis, raised to a non-zero; and
positioning a plurality of electrodes in fluid communication with the workpiece plane.

43. The method of claim 42 wherein forming the vessel includes forming the vessel with a movable vessel surface to change a contour of the vessel from a first contour to a second contour different than the first contour.

44. The method of claim 42, further comprising:
positioning first and second electrodes in fluid communication with the vessel and the workpiece plane;
coupling a first conductive path to the first electrode to provide a first current to the first electrode at a first polarity;
coupling a second conductive path to the second electrode to provide a second current to the second electrode at a second polarity opposite to the first polarity; and
coupling at least one controller to at least the second conductive path to vary the second current.

* * * * *

UNITED STATES PATENT AND TRADEMARK OFFICE
CERTIFICATE OF CORRECTION

PATENT NO. : 7,247,223 B2 Page 1 of 1
APPLICATION NO. : 10/426029
DATED : July 24, 2007
INVENTOR(S) : McHugh et al.

It is certified that error appears in the above-identified patent and that said Letters Patent is hereby corrected as shown below:

In column 7, line 18, after "wall" insert -- 138 --.

In column 12, line 23, delete "3-θ" and insert -- 3-σ --, therefor.

In column 12, line 27, delete "3-θ" and insert -- 3-σ --, therefor.

In column 14, line 61, in Claim 22, delete "claim 15," and insert -- claim 18, --, therefor.

In column 15, line 30, in Claim 25, delete "zero;" and insert -- zero power; --, therefor.

In column 16, line 4, in Claim 30, delete "input/out" and insert -- input/output --, therefor.

In column 16, line 14, in Claim 32, after "member" insert -- , --.

In column 16, line 66, in Claim 39, after "polarity" insert -- , --.

In column 17, line 4, in Claim 40, after "wherein" insert -- at --.

In column 17, line 18, in Claim 41, after "plane" insert -- , --.

In column 18, line 7, in Claim 42, delete "zero;" and insert -- zero power; --, therefor.

Signed and Sealed this

Eighth Day of July, 2008

JON W. DUDAS
*Director of the United States Patent and Trademark Office*